United States Patent [19]

Enichen et al.

[11] Patent Number: 5,763,894
[45] Date of Patent: Jun. 9, 1998

[54] CALIBRATION PATTERNS AND TECHNIQUES FOR CHARGED PARTICLE PROJECTION LITHOGRAPHY SYSTEMS

[75] Inventors: William A. Enichen, Poughkeepsie; Christopher Frederick Robinson, Hyde Park, both of N.Y.

[73] Assignee: International Business Machines Corporation, Armonk, N.Y.

[21] Appl. No.: 788,064

[22] Filed: Jan. 23, 1997

[51] Int. Cl.[6] .................................................. H01J 37/304
[52] U.S. Cl. .................. 250/492.2; 250/491.1; 250/252.1
[58] Field of Search ........................ 250/492.2, 491.1, 250/252.1, 492.3, 492.22

[56] References Cited

U.S. PATENT DOCUMENTS

| | | | |
|---|---|---|---|
| 4,370,554 | 1/1983 | Bohlen et al. | 250/491.1 |
| 4,442,361 | 4/1984 | Zasio et al. | 250/492.2 |
| 4,467,211 | 8/1984 | Smith et al. | 250/492.2 |
| 5,099,133 | 3/1992 | Yamada | 250/492.2 |
| 5,283,440 | 2/1994 | Sohda et al. | 250/492.2 |
| 5,438,207 | 8/1995 | Itoh et al. | 250/492.23 |
| 5,466,549 | 11/1995 | Yamada | 250/492.3 |
| 5,468,969 | 11/1995 | Itoh et al. | 250/492.23 |

*Primary Examiner*—Kiet T. Nguyen
*Attorney, Agent, or Firm*—Scully, Scott, Murphy & Presser

[57] ABSTRACT

A method and system for calibrating a projection electron beam. The electron beam is directed through a first mask pattern and onto a first calibration plate. The electron beam is directed through a second mask pattern and onto a second calibration plate. The first mask pattern and the first calibration plate are used to adjust the orientation of the electron beam, and the second mask pattern and the second calibration plate are used to adjust the magnification of the electron beam.

19 Claims, 5 Drawing Sheets

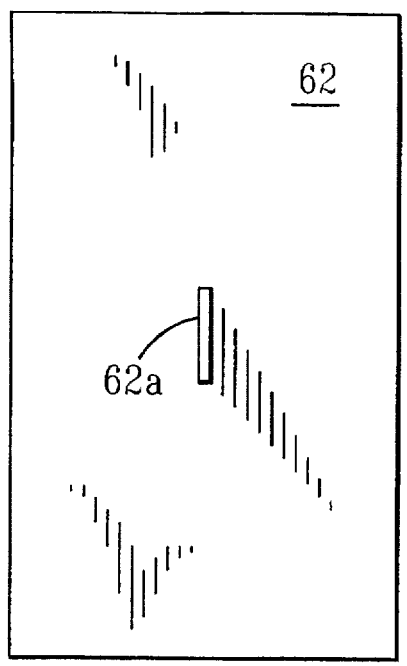
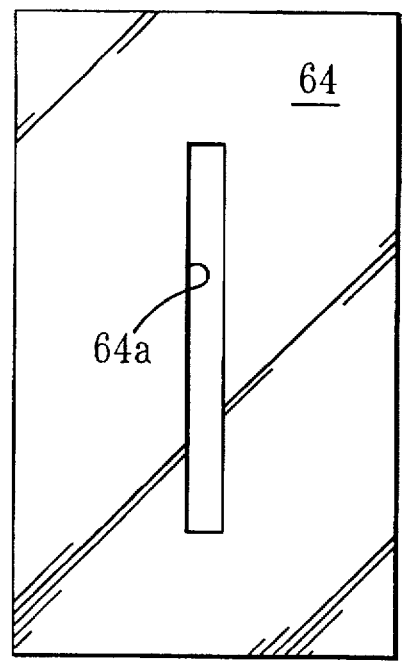
FIG. 2A　　　　　　FIG. 2B
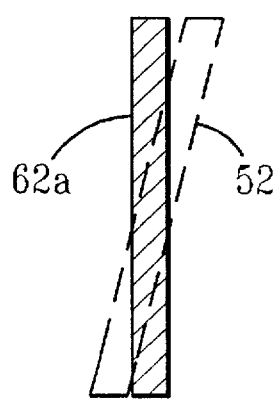
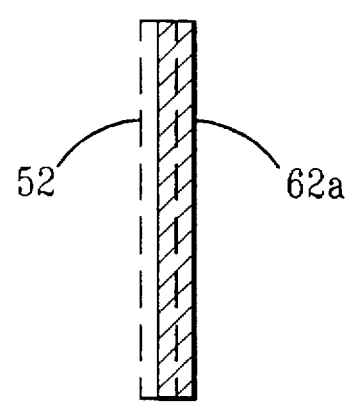
FIG. 3　　　　　　FIG. 4

Broad Signal for Rotated Image

Narrow Signal for Aligned Image 5,763,894

1

CALIBRATION PATTERNS AND TECHNIQUES FOR CHARGED PARTICLE PROJECTION LITHOGRAPHY SYSTEMS

BACKGROUND OF THE INVENTION

This invention generally relates to projection electron beam lithography systems, and more specifically, to methods and apparatus for calibrating such systems.

Electron beam lithography systems are used to make large scale integrated circuits. A principal advantage of these systems is that they may be used to manufacture extremely fine patterns. For example, electron beam lithography systems may be used to form lines having widths of less than 0.05 um with an alignment tolerance of less than 0.02 um.

In a projection electron beam system, the pattern to be transferred onto the wafer is subdivided into subfields or cells. An electron beam is deflected to one of these subfields to illuminate the features on the mask in the subfield. The image of the subfield is then projected onto the wafer. The pattern on the wafer is comprised of many subfields that must seemlessly be stitched together to form a chip on the wafer. This process is repeated for each chip on the wafer. The projected electron beam image is then directed onto a resist coated wafer. The electron beam resist is developed and the pattern in the resist is used as an etch mask or deposition mask on the wafer.

Commonly, as the beam is directed onto the wafer, the beam is demagnified and one or more deflectors are used to direct the beam onto a particular area of the wafer. In order to create a precise circuit on the wafer, it is important that the demagnification of the beam be precise and that the subfield have a very specific rotation and orthogonality at the focal plane of the wafer.

SUMMARY OF THE INVENTION

An object of this invention is to provide a method and apparatus for calibrating a projection electron beam lithography system.

Another object of the present invention is to provide test patterns and techniques to make subfield rotation and magnification adjustments in a projection electron beam lithography system.

A further object of this invention is to provide a system and procedure for measuring and adjusting electron beam subfield magnification and rotation in real time.

These and other objectives are attained with a method and system for calibrating a projection electron beam. In one embodiment of the invention, the electron beam is directed through a first mask pattern and onto a first calibration plate. In a second embodiment, the electron beam is directed through a second mask pattern and onto a second calibration plate. The first mask pattern and calibration plate are used to adjust the orientation of the electron beam, and the second mask pattern and calibration plate are used to adjust the magnification of the electron beam.

For example, the first mask pattern may form the electron beam into a line, and the first calibration plate may have a similar line form. The electron beam is scanned across the calibration line and the rotation of the beam is adjusted until a predetermined correlation is obtained between the electron beam line image and the line on the calibration plate.

In another embodiment of the invention, a calibration plate is provided to calibrate the magnification of the electron beam. The calibration plate has an array of forms, and the electron beam is scanned across the array. The magnification of the electron beam is adjusted until a predetermined correlation is obtained between the electron beam and the array of forms on the calibration plate. Preferably, the array of forms on the calibration plate is a two dimensional array, and includes a plurality of rows of rectangles. Within each row, the spacing between rectangles is substantially uniform; however, that spacing gradually changes from row to row.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 2 shows a calibration plate and a mask plate that may be used to test and calibrate the rotation of the electron beam used in the system of FIG. 1.

FIG. 3 shows the electron beam rotationally misoriented with respect to a line target of the calibration plate shown in FIG. 2.

FIG. 4 shows the electron beam rotated correctly with respect to the line target of the calibration plate.

DETAILED DESCRIPTION OF THE PREFERRED EMBODIMENTS

Figure 1:
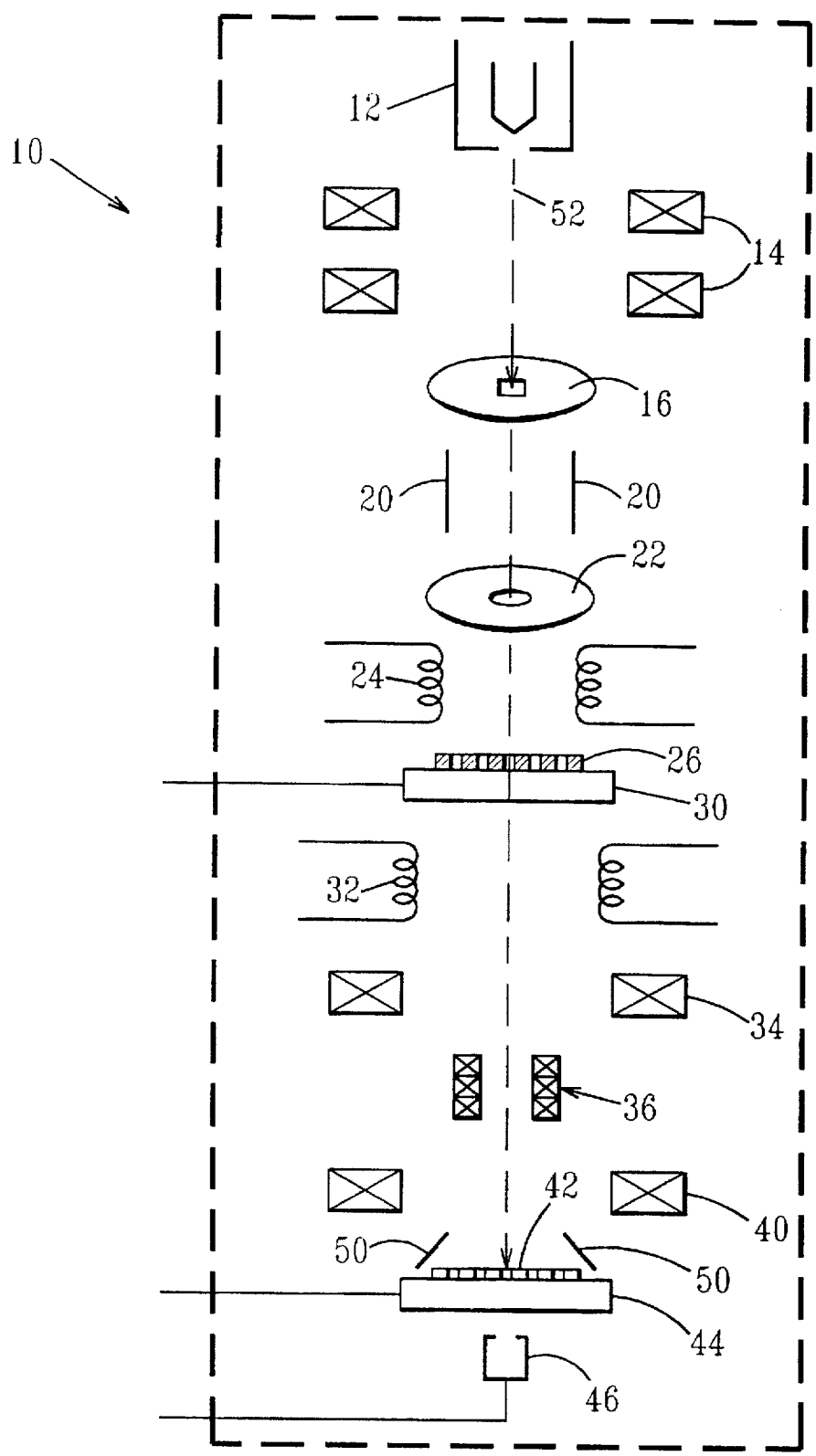
FIG. 1 schematically illustrates a projection electron beam lithography system.

FIG. 1 schematically illustrates an electron beam lithography system 10 comprising electron gun 12, condenser lenses 14, illumination shaping aperture 16, blanking plates 20, blanking aperture 22, mask deflection yoke 24, mask 26, mask stage 30, post deflection yoke 32, reduction lens 34, rotation/magnification correction lenses 36, objective lens 40, wafer 42, wafer stage 44, transmission detector 46 and backscatter detectors 50. Generally, in the operation of system 10, electron gun 12 emits electron beam 52 and directs that beam through illumination aperture 16, which forms the beam into a particular cross-sectional shape. The shaped beam is then positioned by the mask deflection yoke 24 onto mask 26, which further forms the cross-sectional shape of the beam.

Once the final shape of the electron beam 52 is determined, reduction lens 34 may be used to reduce the size, or magnification, of the beam, and correction lenses 36 may be used to adjust the rotation, orthogonality and focus of the beam. The beam 52 is then incident on wafer 42, which is supported by stage 44. Wafer 42 is coated with an electron sensitive resist material, and the beam 52 exposes that resist to a pattern dictated by the illumination aperture 16 and the mask 26. Transmission detector 46 is used to detect and to generate signals representing the intensity of the electrons passing through the wafer 42. Back scatter detectors 50 are provided to detect and to generate signals representing the intensity of the electrons scattered upward from the wafer 42.

Conventional or standard elements may be used in system 10. In addition, as will be understood by those of ordinary skill in the art, system 10 may be provided with additional or different elements depending on the intended use of the system. Also, it may be noted that, typically, the magnification lens in system 10 is used to reduce the size, or to demagnify, the electron beam. The present invention may be used both in charged particle projection lithography systems in which the size of the electron beam is decreased and in such system in which the size of the electron beam is increased. Thus, the term "magnification" is used herein, and in the appended claims, to mean either increasing or decreasing the size of the electron beam.

FIGS. 2A&B shows a calibration plate 62 and a mask plate 64, respectively, that may be used to test the rotation of electron beam 52. Calibration plate 62 includes a line target 62a, preferably made from a good backscatter material such as gold or tungsten, and mask plate 64 forms a line aperture 64a designed to shape electron beam 52 with a line shaped cross-section corresponding to the shape of line target 62a. Target 62a and aperture 64a are preferably dimensioned so that, when plates 62 and 64 are substituted in system 10 for wafer 42 and mask 26, respectively, the target 62a is the same size as the projected image of the electron beam at the target plane.

Figure 5:
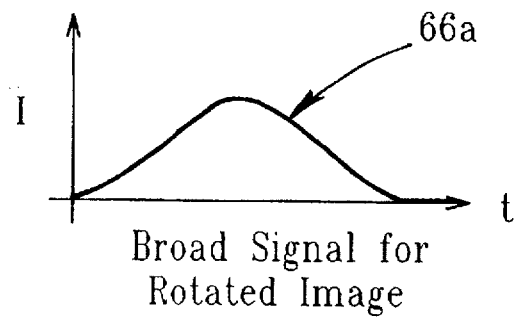
FIG. 5 shows the backscatter signal obtained from the misoriented electron beam as the beam is scanned over the calibration plate.
Figure 6:
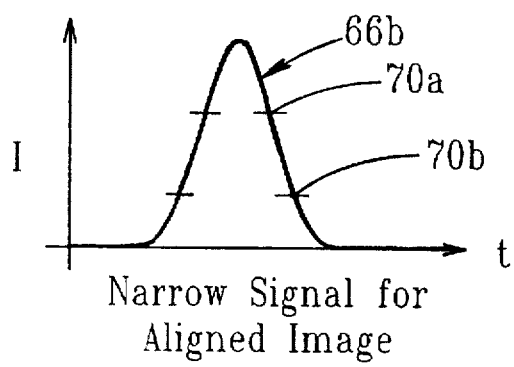
FIG. 6 shows the backscatter signal obtained from the properly oriented electron beam as the beam is scanned over the calibration plate.

To test the rotation of electron beam 52, plates 62 and 64 are placed in system 10 as substitutes for wafer 42 and mask 26, and the line-shaped electron beam is swept back and forth over the line target 62a and a signal is detected from back scatter detectors 50. When the electron beam 52 is not rotationally aligned with the line target 62a, for example as shown in FIG. 3, the back scatter signal, when plotted against time, has a pulse shape with a comparatively broad width, as shown at 66a in FIG. 5. However, when the electron beam 52 is rotationally aligned with the target, as illustrated in FIG. 4, the back scatter signal, again when plotted against time, has a pulse shape with a smaller width and a greater amplitude, as shown at 66b in FIG. 6. The rotation correction lens 36 of system 10 is adjusted, either manually or automatically, in small increments until the pulse width of the backscatter signal is minimized and the signal amplitude is maximized.

A cross-shaped target could be used instead of a line shaped target 62a to determine the proper setting of the rotation lens 36 in each of two orthogonal directions, referred to as the x and y-axes. If a different rotation lens setting is found for each axis, this indicates that the orthogonality of the projected image needs to be adjusted. This is due to astigmatism. Stigmator coils can be adjusted, again either manually or automatically, to correct, or set, that orthogonality.

Figure 7:
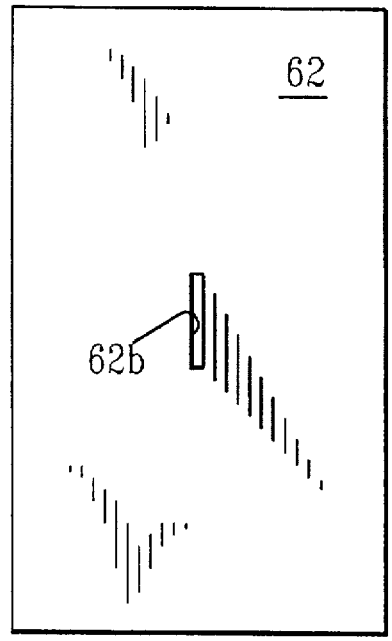
FIG. 7 illustrates an alternate calibration aperture plate that allows the transmitted electron current, instead of the backscatter current, to be used for calibration.

As an alternative procedure, and with reference to FIG. 7, calibration plate 62 may be provided with a slit 62b, and transmission signal electron detector 46 may be located below the calibration plate in system 10. The line shaped electron beam 52 is swept across slit 62b, and the transmission detector collects the electrons passing through that slit 62b. With this procedure, like the above-discussed procedure, the amplitude and the width of the electron beam intensity signal, as detected by the transmission detector 46, vary directly and inversely, respectively, with the rotational alignment between the electron beam and the target 62b—that is, as that alignment increases or improves, the width of the electron beam signal, when plotted versus time, decreases and the amplitude of that electron beam signal increases.

With both of the above-described procedures, the detected electron signal can be digitized and processed automatically to determine the setting for rotation correction lens 36. For instance, the width of the detected electron pulse signal at two or more intensity values, referred to as clip points, for example as shown at 70a and 70b in FIG. 6, can be used to determine when the pulse width is minimized.

Figure 8:
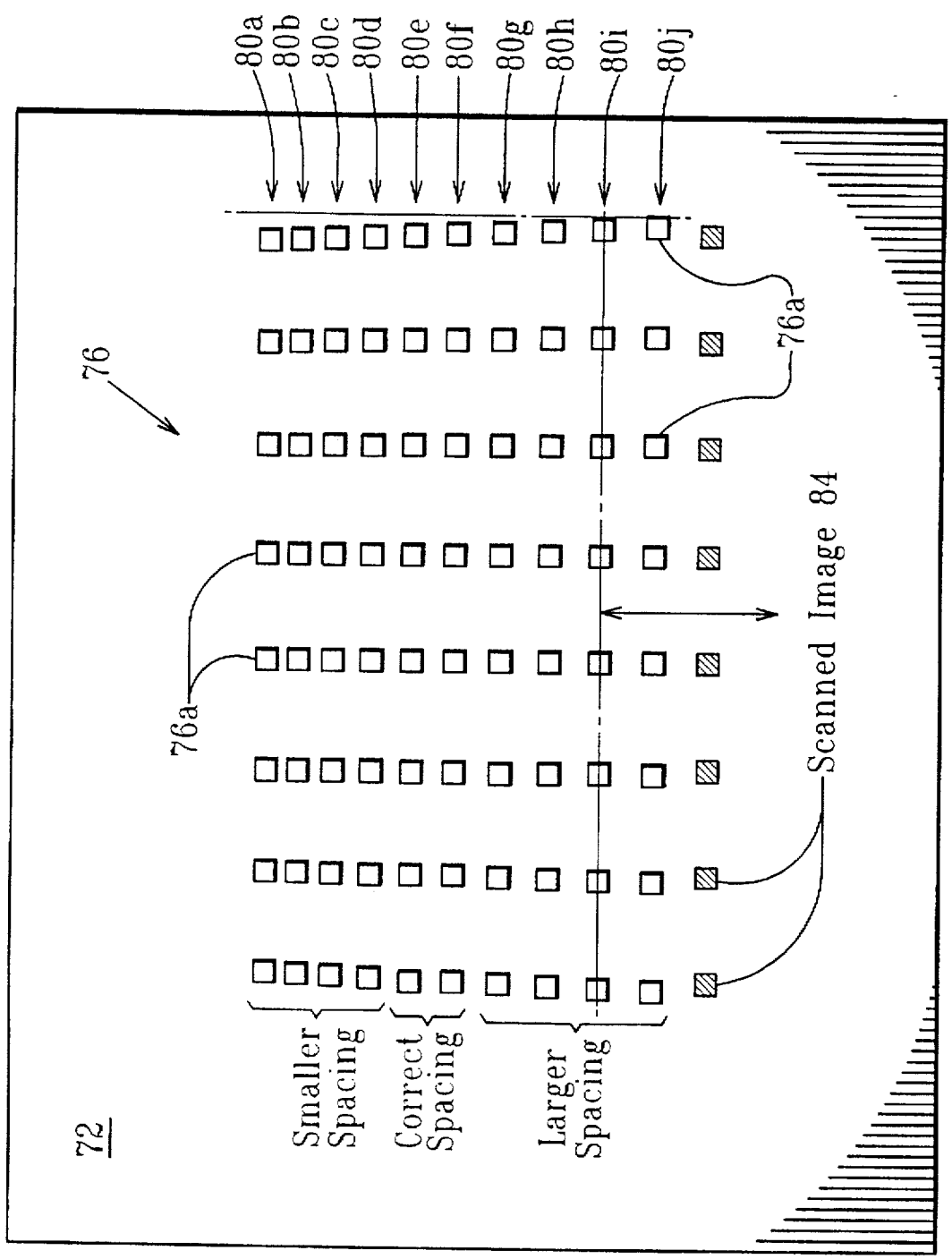
FIGS. 8 and 9 show a calibration plate and a mask plate that may be used to test and to adjust the magnification of the lithography system of FIG. 1.
Figure 9:
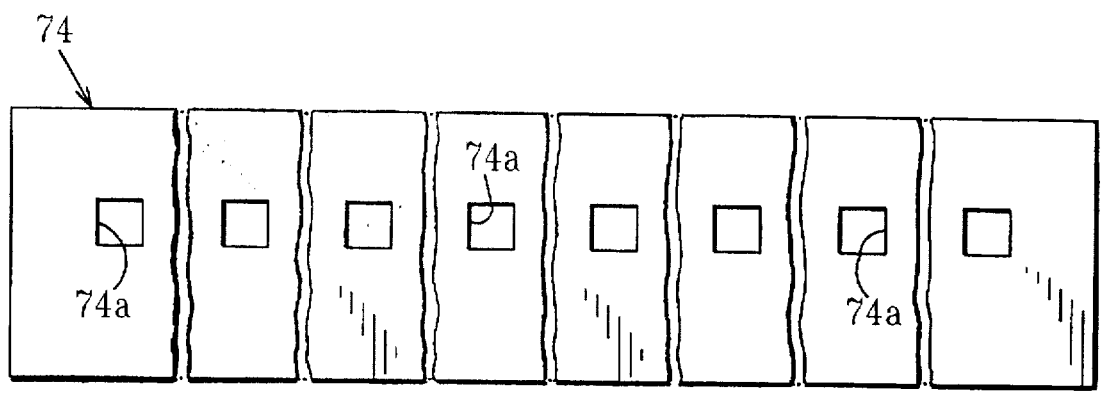

FIGS. 8 and 9 show, respectively, a calibration plate 72 and a mask plate 74 that may be used to test and adjust the magnification of system 10. Plate 72 has an array 76 of rectangles 76a, preferably made of high back scatter material, and this array includes a plurality of rows 80a–80j arranged in a sequence on plate 72. Within each row, the spacing between rectangles is substantially uniform; however, that spacing gradually increases from row to row, in the downward direction as viewed in FIG. 8. With reference to FIG. 9, mask 74 forms a plurality of rectangular apertures 74, designed to form the cross-section of the electron beam 52 into a row of rectangles.

The target array 76 is arranged such that, when plates 72 and 74 are substituted in system 10 for wafer 42 and mask 26, respectively, the center two rows 80e and 80f of rectangles will exactly match the window pattern of the projected image of the electron beam 52 if the magnification of that beam is correct. In a first direction away from these center rows—upward as viewed in FIG. 8—the target rectangles gradually become closer together from row to row; and in the other direction away from the center row—downward as viewed in FIG. 8—the target rectangles gradually become further spaced apart from row to row. More particularly, in the first row 80d of rectangles above row 80e, the target rectangles are closer together than they are in row 80e. Similarly, the rectangles in row 80c are closer together than they are in row 80d, they are closer together in row 80b than in row 80c, and the rectangles are still closer together in row 80a than in row 80b. Conversely, the rectangles are further apart in row 80g than in row 80f, are further apart in row 80h than in row 80g, and are still further apart in row 80i than in row 80h.

To test and adjust the magnification of system 10, plates 72 and 74 are placed in system 10 as substitutes for wafer 42 and mask 26; and electron beam 52, shaped into the window pattern by plate 74, creating an image 84 which is scanned across target array 76. Preferably, the electron beam pattern is scanned such that the window pattern of the electron beam is directed over the rows 80a–80j of target array 76, one row at a time. As the electron beam is scanned across the array 76, the backscatter signal is collected and analyzed. The strongest backscatter signal occurs when the electron beam is coincident with a row of target images, and the strength of that signal is less when the beam is directed onto a target row having a rectangle spacing that is either greater than or less than the spacing of the rectangles of the electron beam.

Figure 10:
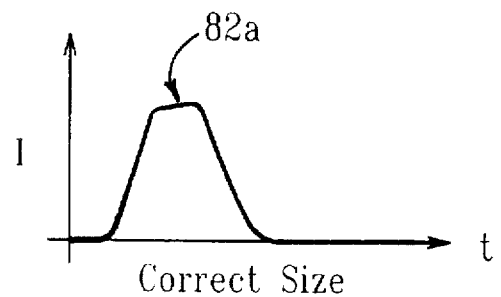
FIGS. 10, 11 and 12 show three backscatter signals that are obtained when the image created by the mask plate of FIG. 9 is scanned over the calibration plate of FIG. 8 and the magnification of the lithography system is, respectively, correct, too large and too small.
Figure 11:
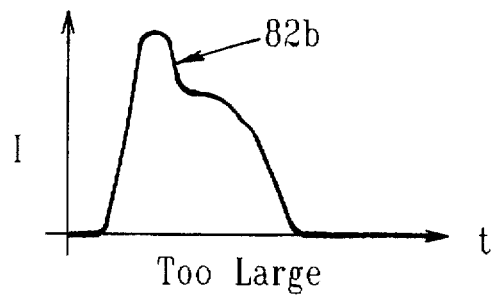
Figure 12:
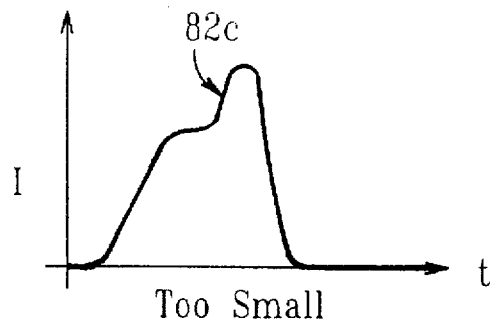

Thus, if the magnification of the electron beam 52 is correct, then, as the beam is scanned across the array 76 from top to bottom and the backscatter signal is collected, that signal, when plotted as a function of time, has a symmetrical shape, as shown at 82a in FIG. 10. In contrast, if the magnification of the electron beam 52 is too large or too small, then the backscatter signal, again when plotted as a function of time, has an asymmetrical shape, with the peaks of the signals being, respectively, to the left or to the right of the center, as shown at 82b and 82c in FIGS. 11 and 12. The flat spot apparent in FIG. 10 in the center of the signal is due to the double row of correctly spaced target rectangles. If an asymmetrical backscatter signal is received—indicating that the magnification of the electron beam 52 is not correct—then that magnification is adjusted, either manually or automatically, until the backscatter signal is symmetric.

The above-discussed adjustments to the rotation and magnification of the electron beam can be done in real time and in a closed loop. To do this, means (not shown) are provided for adjusting the lenses that are used to rotate and magnify the electron beam 52. Also, back scatter detectors 50 are connected to processing electronics (not shown) that receive the signals from those detectors. In this mode, the system processes and analyzes the detected signals and then generates control signals that are applied to the adjustment means to make the appropriate adjustments to the rotation and magnification correction lenses. In addition, the magnification and rotational adjustments to the electron beam may be made independent of each other.

The present invention is of particular utility when mask 26 of system 10 has a multitude of subfields, and electron beam 52 is transmitted through each of those subfields, one at a time, to form a multitude of electron beam subfields. Properly adjusting the magnification and rotational alignment of the individual electron beam subfields helps to fit accurately together the individual subfield patterns formed on wafer 42. The methods and systems disclosed herein may be used in other system, however; and, for example, the present invention may be practiced with an electron beam that is used to illuminate the whole field, rather than just a subfield, of wafer 26.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

Having thus described our invention, what we claim as new, and desire to secure by Letters Patent is:

1. A method of calibrating a projection electron beam lithography system, comprising the steps of:
   providing a first mask pattern and a first calibration plate pattern;
   providing a second mask pattern and a second calibration plate pattern;
   producing an electron beam;
   magnifying the electron beam;
   orienting the electron beam;
   directing the electron beam through the first mask pattern and onto the first calibration plate pattern;
   using the first mask pattern and the first calibration plate pattern to adjust the rotational orientation of the electron beam;
   directing the electron beam through the second mask pattern and onto the second calibration plate pattern; and
   using the second mask pattern and the second calibration plate pattern to adjust the magnification of the electron beam.

2. A method according to claim 1, wherein the step of using the second mask pattern and the second calibration plate pattern to adjust the magnification of the electron beam includes the step of adjusting the magnification of the electron beam independent of the adjustment to the rotational orientation of the electron beam.

3. A method according to claim 1, wherein:
   the first calibration plate pattern includes a defined pattern; and
   the step of using the first mask pattern and the first calibration plate pattern to adjust the rotational orientation of the electron beam includes the steps of
   i) scanning the electron beam across the defined pattern,
   ii) generating a signal representing a degree of rotational alignment between the electron beam and the defined pattern,
   iii) measuring said signal over time during the scanning step,
   iv) determining a time value representing a width of said signal when plotted versus time, and
   v) adjusting the orientation of the electron beam until said time value reaches a predefined value.

4. A system for adjusting an electron projection lithography beam, comprising:
   a mask having an aperture;
   a calibration plate including a corresponding pattern;
   means to produce an electron beam and to direct the electron beam through the aperture of the mask to form a shaped electron beam;
   means to rotate the shaped electron beam;
   means to scan the shaped electron beam across the pattern of the calibration plate;
   means to generate a signal representing a degree of alignment between the shaped electron beam and said pattern;
   means to measure said signal over time;
   means to determine a time value representing a width of said signal when plotted versus time; and
   means to adjust the rotational orientation of the shaped electron beam until said time value reaches a predefined range.

5. A system according to claim 4, wherein the means to adjust the rotational orientation of the shaped electron beam includes means to adjust said orientation until said time value is less than a predefined value.

6. A system according to claim 4, wherein the means to adjust the rotational orientation of the shaped electron beam includes means to adjust the orthogonality.

7. A method of calibrating an electron beam projection lithography system, comprising the steps of:
   providing a mask and a calibration plate, the mask having a group of apertures defining a first array, the calibration plate including means defining a second, corresponding array;
   producing an electron beam;
   directing the electron beam through the apertures of the mask to shape the electron beam into said first array;
   magnifying the shaped electron beam;
   directing the shaped electron beam onto the calibration plate;
   scanning the shaped electron beam across the array on the calibration plate;
   measuring a correlation between the shaped electron beam and the array on the calibration plate; and adjusting the magnification of the shaped electron beam until a predetermined correlation is obtained between the shaped electron beam and the array on the calibration plate.

8. A method according to claim 7, wherein:

the array of forms of the calibration plate includes a plurality of rows of forms;

the measuring step includes the step of measuring a correlation between the shaped electron beam and each of said plurality of rows of forms.

9. A method according to claim 8, wherein the measuring step includes the step of identifying one of the plurality of rows having the highest correlation with the shaped electron beam.

10. A method according to claim 8, wherein:

the plurality of rows includes first, second and third rows; and the adjusting step includes the step of adjusting the magnification of the shaped electron beam until the correlation between the shaped electron beam and one of said rows is greater than the correlation between the shaped electron beam and the other two of said rows.

11. A method according to claim 10, wherein:

said plurality of rows are arranged in a sequence on the calibration plate; and the adjusting step includes the step of adjusting the magnification of the shaped electron beam until the correlation between the shaped electron beam and the second of the rows in the sequence is greater than the correlation between the shaped electron beam and each of the first and third rows in the sequence.

12. A method according to claim 8, wherein:

the first array of the mask includes a first row of forms; and the second array of the calibration plate include a plurality of said row of forms.

13. A method according to claim 7, wherein:

the array of the mask is a one-dimensional array; and the array of the calibration plate is a two-dimensional array.

14. A system for calibrating an electron beam projection lithography system, comprising:

a mask having a group of apertures defining a pattern of forms;

a calibration plate including an array of forms;

means to produce an electron beam and to direct the electron beam through the apertures of the mask to shape the electron beam into said pattern of forms;

means to magnify the shaped electron beam;

means to scan the shaped electron beam across the array of forms on the calibration plate;

means to measure a correlation between the shaped electron beam and the array of forms on the calibration plate; and means to adjust the magnification of the shaped electron beam until a predetermined correlation is obtained between the shaped electron beam and the array of forms on the calibration plate.

15. A system according to claim 14, wherein:

the array of forms of the calibration plate include a plurality of rows of forms; and the means to measure includes means to measure a correlation between the shaped electron beam and each of said plurality of rows of forms.

16. A system according to claim 15, wherein:

the pattern of forms of the mask includes a first row of forms; and the plurality of rows of forms of the calibration plate include a plurality of said row of forms.

17. A system according to claim 14, wherein:

the array of forms on the calibration plate includes first, second and third rows; and the means to adjust includes means to adjust the magnification of the shaped electron beam until the correlation between the shaped electron beam and one of said rows is greater than the correlation between the shaped electron beam and the other two of said rows.

18. A system according to claim 17, wherein:

said first, second and third rows are arranged in a sequence on the calibration plate; and the means to adjust includes means to adjust the magnification of the second electron beam until the correlation between the shaped electron beam and the second of the rows in the sequence is greater than the correlation between the shaped electron beam and each of the first and third rows in the sequence.

19. A system according to claim 14, wherein:

the pattern of forms on the mask is a one-dimensional array; and the array of forms on the calibration plate is a two-dimensional array.

\* \* \* \* \*